United States Patent
Sasaki

[19]

[11] Patent Number: 6,121,828
[45] Date of Patent: Sep. 19, 2000

[54] DEMODULATOR

[75] Inventor: Eisaku Sasaki, Tokyo, Japan

[73] Assignee: NEC Corporation, Tokyo, Japan

[21] Appl. No.: 09/312,986

[22] Filed: May 17, 1999

[30] Foreign Application Priority Data

May 19, 1998 [JP] Japan ................................. 10-137254

[51] Int. Cl.$^7$ ............................. H03D 3/00; H04L 27/38

[52] U.S. Cl. ..................... 329/304; 329/306; 375/261; 375/325; 375/329; 375/345

[58] Field of Search ........................... 329/304–310; 375/261, 325, 329–333, 345

[56] References Cited

U.S. PATENT DOCUMENTS

| | | | |
|---|---|---|---|
| 4,669,090 | 5/1987 | Betts et al. | 375/8 |
| 5,841,814 | 11/1998 | Cupo | 375/321 |
| 6,026,127 | 2/2000 | Lewicki et al. | 375/319 |

FOREIGN PATENT DOCUMENTS

| | | |
|---|---|---|
| 7-170306 | 7/1995 | Japan . |
| 8-4245 | 1/1996 | Japan . |

*Primary Examiner*—David Mis
*Attorney, Agent, or Firm*—Ostrolenk, Faber, Gerb & Soffen, LLP

[57] ABSTRACT

It is an object of the invention to provide a demodulator, which improves a BER characteristic in a ordinary state, reduce a time constant of a AGC amplifier, and quickly follows the fluctuation of an input signal level. A demodulator for $2^q$-QAM system is composed of an AGC amplifier, which keeps an average power of its output signal constant, A/D convectors for A/D converting the output signal of the AGC amplifier, an equalizer for removing interference components between codes contained in output signals of the A/D convectors, AGC circuits, which operate so that convergent points of output signals of the equalizer have amplitudes expressed by binary numbers composed of q/2 bits, and a control circuit, which is supplied with output signals of the AGC circuits and generates control signals for the AGC circuits.

14 Claims, 6 Drawing Sheets

DEMODULATOR

FIELD OF THE INVENTION

The invention relates to a demodulator, and especially to a demodulator, which keeps an average power of an IF input signal constant by means of an analog AGC circuit and compensates an error in the IF input signal by means of a digital AGC circuit situated after an equalizer so that an output signal of the demodulator is represented by regular signal points corresponding to the optimum BER (bit error rate) characteristic.

In a conventional demodulator having a coherent detector disclosed in Japanese Patent Kokai 63-119331, a following method is adopted in order to avoid a situation that an amplitude of an input signal of the A/D convertor becomes larger than that in an ordinary state (a state, in which there is no fading) on account of a waveform distortion of the input signal caused by fading and exceeds a discriminable range (a dynamic range) of the A/D convertor. That is to say, the amplitude of the input signal of the A/D convertor is reduce by multifling it by a decision range expansion (DRE, hereinafter) coefficient so that it becomes smaller than the dynamic range of the A/D convertor, and thereafter an output of an equalizer is multiplied by a reciprocal number of the DRE coefficient and returned to its original value.

However, in the aforementioned demodulator, since the input signal level is uniformly reduced, an accuracy of quantization of the A/D convertor in the ordinary state is deteriorated especially in case of a QAM (quadrature amplitude modulation) system with a higher modulation level, so that BER (bit error rate) characteristic in the ordinary state is deteriorated.

In the demodulator disclosed in Japanese Patent Kokai 07-170306, a gain of an AGC amplifier for amplifying an input modulated wave is controlled so that the maximum amplitude of an input signal of an A/D convertor is kept to be constant and a dynamic range of the A/D convertor is completely used.

Accordingly, to the demodulator mentioned in the above, the BER characteristic in the ordinary state is noticeably improved, but a time constant of the AGC amplifier becomes large especially in case of a multi-level modulation system with a higher modulation level, so that the demodulator cannot quickly follow the fluctuation of the amplitude of the input signal level.

SUMMARY OF THE INVENTION

Accordingly, it is an object of the invention to provide a demodulator, which reduces a time constant of an AGC amplifier, improves a bit error rate (BER) characteristic in an ordinary state and quickly follows a fluctuation of an input signal by using the AGC amplifier for amplifying a modulated wave.

It is a further object of the invention to provide a demodulator, which reduces a time constant of AGC amplifiers, improves a BER characteristic in an ordinary state and quickly follows a fluctuation of an input signal by using the AGC amplifiers for amplifying base band (BB) analog signals.

According to the first feature of the invention, a demodulator comprises:

an analog automatic gain control (AGC, hereinafter) circuit, which is supplied with a modulated wave and operates so that an average power of an output signal thereof is kept to be constant, analog to digital (A/D, hereinafter) convectors of the I and Q channels, which A/D convert base band (BB, hereinafter) analog signals of the I and Q channels obtained by demodulating the output signal of the analog AGC circuit, an equalizer, which is supplied with output signals of the A/D convertors of the I and Q channels and removes interference components between codes contained therein, digital AGC circuits of the I and Q channels, which are supplied with output signals of the equalizer and operate so that convergent points of the output signals of the equalizer have amplitudes expressed by binary numbers composed of q/2 bits in case that q is even and (q+1)/2 bits in case that q is odd, and a control circuit, which is supplied with output signals of the digital AGC circuits of the I and Q channels and generates control signals for the digital AGC circuits of the I and Q channels.

According to the second feature of the invention, a democulator comprises:

demodulating circuits of the I and Q channels, which are supplied with a modulated wave and convert it into BB analog signals of I and Q channels, analog AGC amplifiers of I and Q channels, which amplify the BB analog signals of I and Q channels so that their average output powers are kept to be constant, A/D convectors of the I and Q channels, which A/D convert the BB analog signals supplied from the analog AGC amplifiers of I and Q channels, an equalizer, which is supplied with output signals of the A/D convectors of I and Q channels and removes interference components between codes contained therein, digital AGC circuits of the I and Q channels, which are supplied with output signals of the equalizer and operate so that convergent points of the output signals of the equalizer have amplitudes expressed by binary numbers composed of q/2 bits in case that q is even and (q+1)/2 bits in case that q is odd, and a control circuit, which is supplied with output signals of the digital AGC circuits of the I and Q channels and generates control signals for the digital AGC circuits of the I and Q channels.

BRIEF DESCRIPTION OF THE DRAWINGS

The invention will be explained in more detail in conjunction with appended drawings, wherein.

DESCRIPTION OF THE PREFERRED EMBODIMENTS

Figure 1:
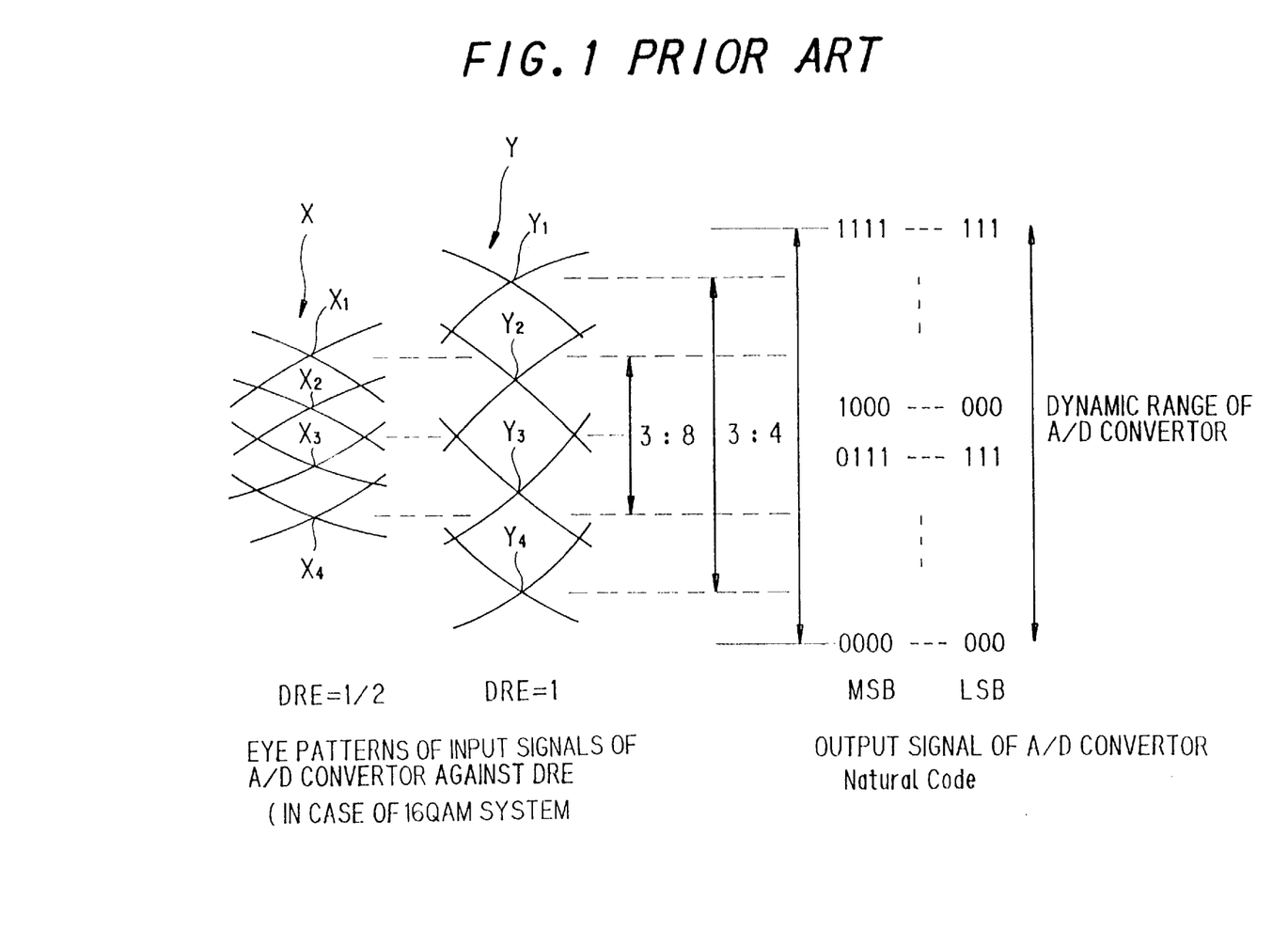
FIG. 1 shows a relation between an amplitude of an input signal of a A/D convertor and a DRE coefficient in a conventional demodulator for a 16 QAM system.
Figure 2:
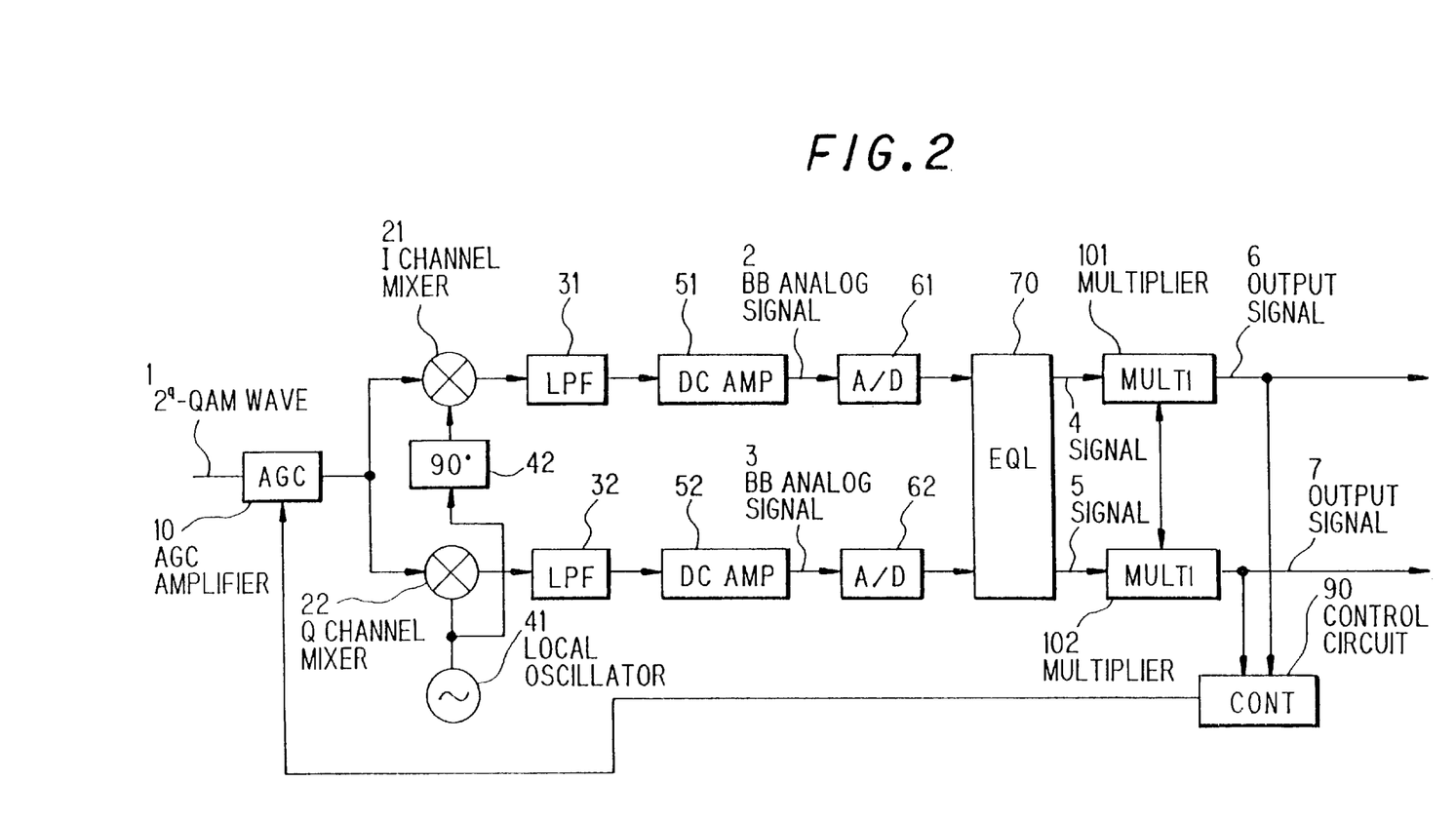
FIG. 2 shows a structure of a conventional demodulator.

Before explaining a demodulator according to the invention in the preferred embodiments, the aforementioned conventional demodulator w ill be explained in FIGS. 1 and 2.

FIG. 1 shows a relation between an amplitude on and input signal of the A/D convertor and a value of a DRE coefficient in a 16 QAM (quadrature amplitude modulation) system. In FIG. 1, an eye pattern of the input signal X having convergent points of the amplitudes, $X_1$ to $X_4$, and that of the input signal $Y_1$ to $Y_4$ are shown. The input signal X has an amplitude given as ⅜ of the dynamic range of the A/D convertor, and the input signal Y has an amplitude given as ¾ of the dynamic range of the same. In the conventional demodulator having a coherent detector, if a gain of an AGC amplifier situated before the A/D convertor is controlled so that the doubling of the amplitude of an output signal of the equalizer is equal to a normal value, the amplitude of the input signal of the A/D convertor in an ordinary case becomes a half of the dynamic range of the A/D convertor as shown in FIG. 1. In case that fading occurs, interference component is added to the input signal of the A/D convertor, but it is removed from the output signal of the equalizer. As the result, if the gain of the AGC amplifier is controlled so that the doubling of the amplitude of the output of equalizer becomes a normal value, the amplitude of the input signal of the A/D convertor becomes larger than that in the ordinary state. In a word, in the conventional modulator, since the gain of the AGC amplifier is controlled so that an electrical power of a desired wave involved in the input signal of the A/D convertor is kept to be constant, in case that interference component is present and D/U (desired to undesired power ratio) is reduced, an electrical power of D+U increases in order to keep the power of D constant. A multiplication factor of an after stage of the equalizer (a reciprocal number of the DRE coefficient) is generally selected to be 4/3 to 2 in order to avoid a situation that the amplitude of the input signal of the A/D convertor exceeds its dynamic range even in case of deep fading. The output signals of the demodulator are represented by signal pints of the 16 QAM system. In case that the analog input signals of the A/D convertor at the optimum sampling phases are represented by the signal points of the 16 QAM system, the DRE coefficient is made to be one.

In the aforementioned structure, since the input signal of the A/D convertor is uniformly reduced in order to cope with a situation that a waveform distortion of the input signal occurs because of fading, an accuracy of quantization of the A/D convertor in the ordinary state is deteriorated especially in case of a multi-level modulation system with a higher modulation level, such as a 256 QAM system, the BER characteristic thereof is deteriorated.

In order to solve the aforementioned problems, the present applicant proposed a demodulator, in which an AGC amplifier is controlled so that the maximum amplitude of an input signal of an A/D convertor was kept to be constant, and an amplitude of the signal was adjusted by a digital AGC circuit situated after an equalizer (Japanese Patent Kokai 07-170306).

FIG. 2 shows a conventional demodulator disclosed by the present applicant in Japanese Patent Kokai 07-170306. This demodulator comprises an AGC amplifier (an analog AGC circuit) 10 operating in an IF band, an I channel mixer 21, a Q channel mixer 22, a local oscillator 41, a 90° phase shifter 42, low pass filters (LPFs) 31 and 32, DC amplifiers 51 and 52, A/D convectors 61 and 62, an equalizer (an EQL) 70, multipliers 101 and 102 and a control circuit 90. The multipliers 101 and 102 multiply the outputs of the equalizer 70 by correction factors k.

In this demodulator, the control circuit 90 controls the gain of the AGC amplifier 10 so that the maximum amplitude (D+U) of base band signals (BB signals, hereinafter) outputted from the DC amplifiers 51 and 52 are kept to be constant and the dynamic ranges of the A/D convectors 61 and 62 are completely used. The gain control of the AGC amplifier 10 are compensated by multiplying the outputs of the equalizer 70 by the correction factors k by means of the multipliers 101 and 102.

However, according to the conventional demodulator shown in FIG. 2, it is necessary to steeply increase the time constant of the AGC amplifier in order keep the maximum amplitude of the input signal of the A/D convertor constant in case of a multi-level modulation system with a higher modulation level, in which the probability of occurrence of the maximum amplitude of the input signal is low, so that it is difficult to follow a fluctuation of the amplitude of a signal propagated through a transmission channel.

Thereafter, a demodulator according to the invention will be explained in detail.

Figure 3:
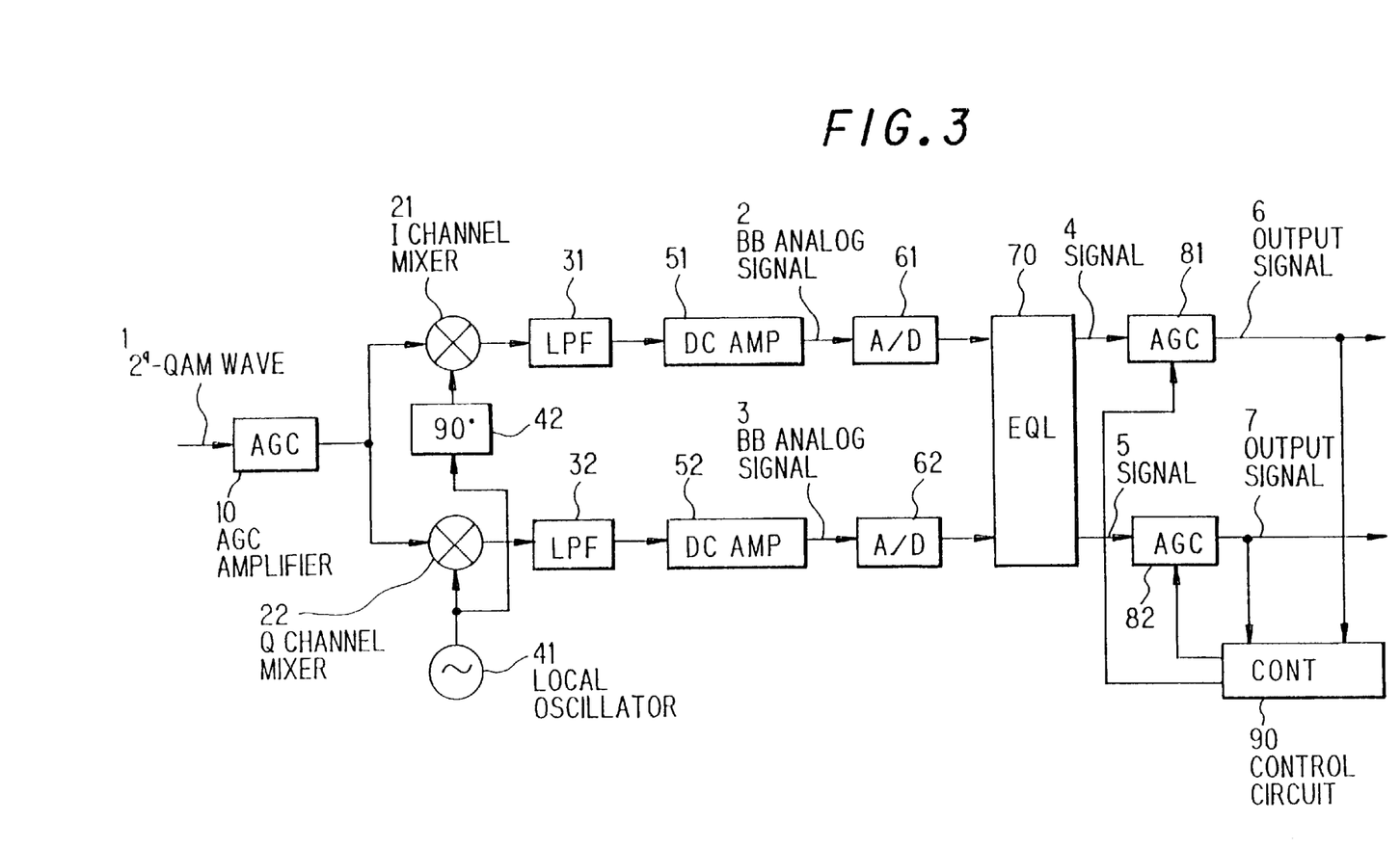
FIG. 3 shows a structure of a demodulator according to the first preferred embodiment of the invention.

FIG. 3 shows a demodulator according to the first preferred embodiment of the invention. The demodulator comprises an AGC amplifier (an analog AGC circuit) 10 operating in an IF band, an I channel mixer 21, a Q channel mixer 22, a local oscillator 41, a 90° phase shifter 42, low pass filters (LPFs) 31 and 32, DC amplifiers 51 and 52, A/D convectors 61 and 62, an equalizer (an EQL) 70, digital AGC circuits (sometimes expressed by AGC circuits, hereinafter) 81 and 82, and a control circuit 90. The local oscillator 41 is a voltage controlled oscillator (a VCO) or a voltage controlled crystal oscillator (a VCXO).

In the aforementioned modulator, an input signal thereof is a $2^q$-QAM wave 1 and supplied to the AGC amplifier 10. The gain of the AGC amplifier 10 is automatically controlled so that the average power of its output signal maintains a constant value, which is determined by an external circuit. The output of the AGC amplifier 10 is supplied to the I channel mixer 21 and the Q channel mixer 22.

In the mixers 21 and 22, the input signal is multiplied by two orthogonal sinusoidal signals derived from the local oscillator 41, and as the result, signals of I and Q channels are outputted. Since these output signals contains not only the desired BB (base band) signals but also IF band signals, the desired BB signals are taken out by the LPFs 31 and 32. These BB signals are respectively amplified by the DC amplifiers 51 and 52 up to discriminable levels, and thereafter converted into digital signals of two series by the A/D convectors 61 and 62.

The outputs of the A/D convectors 61 and 62 are supplied to the equalizer 70 in order to remove waveform distortions caused by a frequency distortion of a transmission characteristic of the transmission channel. The equalizer 70 is formed of a linear equalizer or a decision feedback equalizer, which operates for the BB digital signal. Signals 4 and 5, interference components of which have been removed by the equalizer 70, are respectively supplied to the AGC circuits 81 and 82, which respectively correspond to the I and Q channels. The AGC circuits 81 and 82 respectively multiply the input signals by coefficients, which are obtained by integrating AGC control signals supplied from the control circuit 90.

The control circuit 90 detects the differences between the output levels of the AGC circuits 81 and 82, both respectively corresponding to eye patterns of the I and Q channels, and the their predetermined levels, and informations thereon are supplied to the AGC circuits 81 and 82. The control circuit 90 outputs an oscillating frequency-control signal to the local oscillator 41 and a control signal to the equalizer 70 also. From the output signals of the AGC circuits 81 and 82, the upper q/2 signals are taken out as the modulated results from each of the AGC circuits 81 and 82. For example, in the case of a 16QAM system, since q=4, two output signals are taken out from each of the I and Q channels.

The AGC circuits 81 and 82 are respectively composed of integrators (not shown), which output AGC gains by integrating the control signals supplied from the control circuit 90, and multipliers (not shown), which multiply the input signals by outputs of the integrators. In case that the outputs of the integrators are more than 1, gains of the AGC circuits 81 and 82 are positive, and in case that less than 1, they are negative.

Thereafter, the operation of the demodulator according to the invention will be described in detail. The A/D convectors 61 and 62 respectively sample the input analog BB signals 2 and 3 with a period of a sampling clock signal and covert them into digital signals. In this case, the signals beyond the limits of the discriminable ranges of the A/D convectors 61 and 62 are clipped to the maximum or minimum values of the output digital signals. As the result; information on the analog signals are lost, and the characteristic of the demodulator is deteriorated. Accordingly, the input signals 2 and 3 at the time of sampling should be confined within the discriminable ranges of the A/D convectors 61 and 62.

Especially, in case that the process of the demodulated signal, such as regeneration of a clock signal, roll off filtering or etc, is executed by a digital signal process, since A/D conversion is carried out with a clock signal corresponding a speed more than two times as high as that of modulation on the basis of the sampling theorem, it is necessary to convert a transient portion having a larger amplitude by limitation of a frequency band without loss of information on the analog waveform.

The AGC amplifier 10 is provided with a detector circuit therein, and operate so that an average power of its output signal maintains a predetermined value.

The output signal of the AGC amplifier 10 is multiplied by the output of the local oscillator 41 at the mixers 21 and 22. The outputs of the mixer 21 and 22 are supplied to the LPFs 31 and 32, from which the BB signals are extracted. The BB signals are respectively amplified by the DC amplifiers 51 and 52 having fixed gains and supplied to the A/D convectors 61 and 62. Accordingly, the average powers of the input signals of the A/D convectors 61 and 62 are kept to be constant by a function of the AGC amplifier 10, so long as the characteristics of the mixers, the LPFs and the DC amplifiers are unchanged.

When fading occurs in the transmission channel, a peak factor, which is defined as a ratio of the average power of the modulated wave to the instantaneous maximum power thereof, is fluctuated. Accordingly, in case that the level of the modulated wave is controlled based on the average power thereof as in the demodulator according to the invention, the maximum amplitude of the input signal of the A/D convertor is fluctuated in accordance with the condition of the transmission channel. Although the fluctuation of the input signal is affected by the depth of fading, the frequency and etc., it can be confirmed by a computer simulation that the fluctuation is generally contained within a range of 2 dB.

Figure 4:
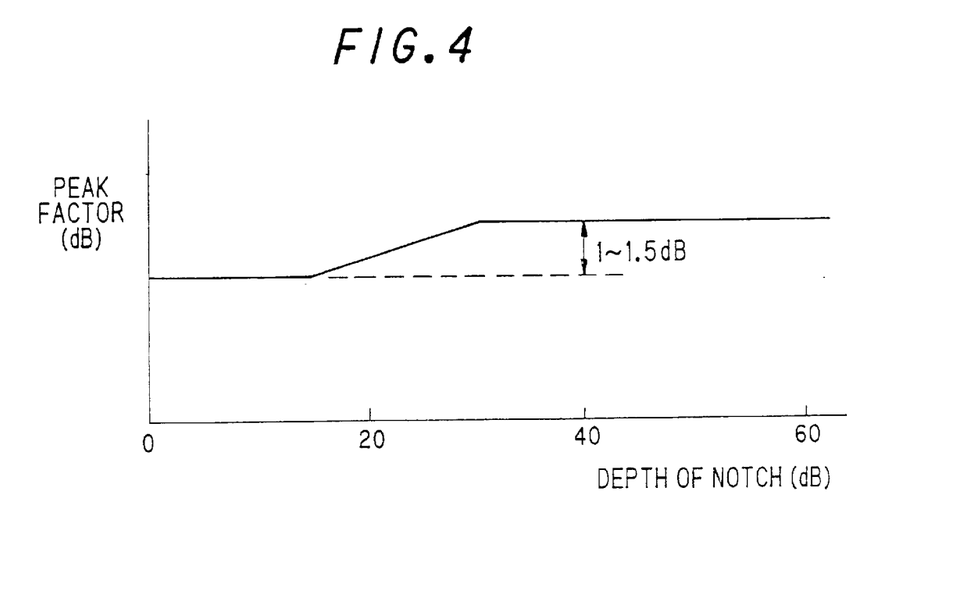
FIG. 4 shows a width of a fluctuation of a peak factor obtained by a computer simulation.

FIG. 4 shows the width of the fluctuation of the peak factor obtained by a computer simulation. As seen from FIG. 4, if the average power of the modulated wave is kept to be less than a power corresponding to the maximum disciminable ranges (the dynamic ranges) of the A/D convectors 61 and 62 by 2 dB by means of the AGC amplifier 10, the maximum amplitudes of the input signals of the A/D convectors 61 and 62 do not exceed the dynamic ranges of the A/D convectors 61 and 62, even in case that fading occurs.

Figure 5:
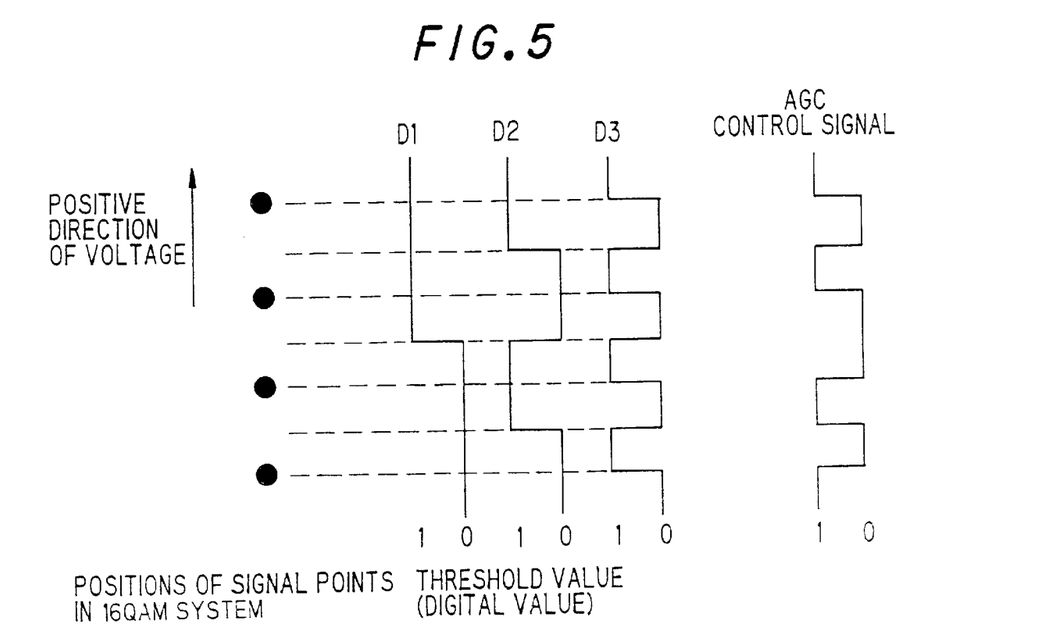
FIG. 5 shows a control signal of a AGC circuit and threshold values (digital values) of an output signal of each channel.

FIG. 5 shows the control signals of the AGC circuits 81 and 82 and threshold values (digital values) of the output signals of the respective channels. The control circuit 90 supplies the control signals to the AGC circuit 81 and 82 so that the output signal levels of the respective channels agree with the threshold values shown in FIG. 5. The control signal is selected so that it is given as EX-NOR of D1, which is MSB (a most significant bit) of the digital signal, and D3, which is 3SB (an error bit) of the same. Then, in case that an amplitude of an input signal near a signal point is smaller than a predetermined value, the control signal is at "0" level, and in case that it is larger than the predetermined value, the control signal is at "1" level. In conformity with the aforementioned results, if the AGC circuits 81 and 82 are constructed so that the gains are increased in case that the control signals are "0" and the gains are reduced in case that the control signals are "1", the amplitudes of the output signals 6 and 7 of the AGC circuits 81 and 82 are controlled so that they agree with the predetermined values.

According to the demodulator according to the invention, since the input signal level of the A/D convertor in the ordinary state, in which there is no fading, can be increased, the bit error rate (BER) characteristic in the ordinary state can be improved. Moreover, the time constant of the AGC amplifier, which keeps the average output power thereof constant, is not noticeably increased in accordance with the modulation level, the time constant of the AGC amplifier can be reduced as compared with the conventional AGC amplifier, which keeps the maximum amplitude of the input signal of the A/D convertor constant. As the result, the demodulator according to the invention can quickly follow the fluctuation of the input signal level.

Figure 6:
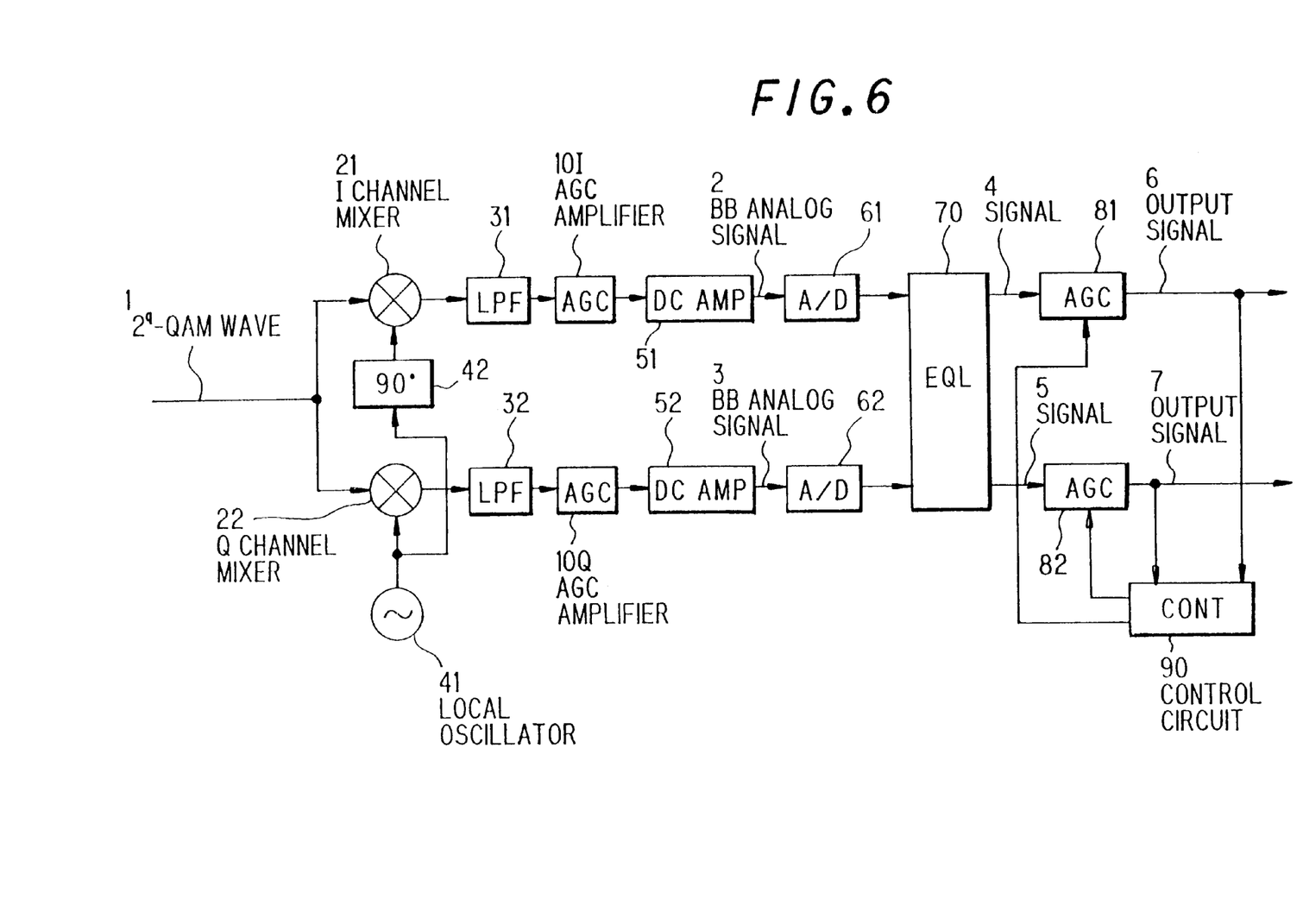
FIG. 6 shows a structure of a demodulator according to the second preferred embodiment of the invention.

In the first preferred embodiment of the invention mentioned in the above, since the average input powers of the A/D convectors 61 and 62 are kept to be constant and deviations from amplitudes corresponding to the optimum BER characteristics are compensated by the ACC circuits 81 and 82 situated after the equalizer 70, the AGC amplifier 10 for keeping its output power constant can be situated on paths of the BB band analog signals of I and Q channels. FIG. 6 shows the second preferred embodiments of the invention, in which AGC amplifiers 10I and 10Q for the BB analog signals are respectively inserted in the paths of I and Q channels. Moreover, the invention can be applied to a modulator using semi-coherent detection circuit, in which coherency with the carrier wave is established by means of a BB digital signal.

Figure 7:
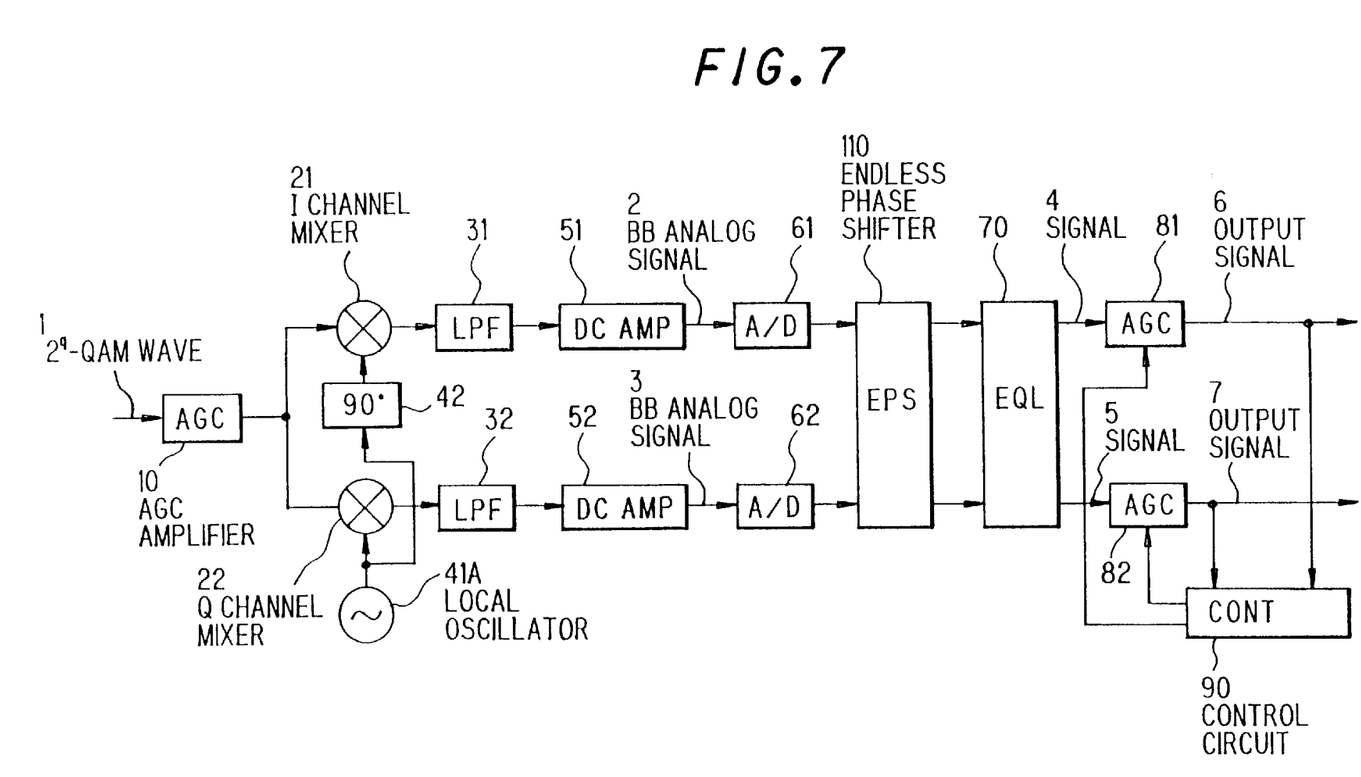
FIG. 7 shows a structure of a demodulator according to the third preferred embodiment of the invention.

FIG. 7 shows another demodulator according to the invention using a semi-coherent detection circuit, which is the third preferred embodiment of the invention. This demodulator is provided with an AGC amplifier 10 operating in the IF band, an I cannel mixer 21, a Q channel mixer 22, a local oscillator 41A, a 90° phase shifter 42, LPFs 31 and 32, DC amplifiers 51 and 52, A/D convectors 61 and 62, an endless phase shifter (an EPS) 110, an equalizer (an EQL) 70, AGC circuits 81 and 82, and a control circuit 90.

Thereafter, a difference between the demodulator shown in FIG. 7 and that shown in FIG. 3 will be explained. The local oscillator 41 shown in FIG. 3 is a VCO or a VCXO controlled by the control circuit 90. On the other hand, the local oscillator 41A has an oscillating frequency, which is close to a frequency of a carrier wave but is not coherent therewith, and is not controlled by the control circuit 90 or other circuits.

Accordingly, the input signals of the A/D convectors 61 and 62 still contain a phase rotation of the carrier wave, and rotate with a residual frequency, which corresponds to the difference in the frequency between the carrier wave and the output of the local oscillator 41A. The residual frequency is removed by the endless phase shifter (the EPS) 110. The EPS 110 provides the input signal of the A/D convertor with a phase rotation of the residual frequency in the reverse direction based on the phase information supplied from the control circuit 90. As the result, the coherency of the output of the EPS 110 with the carrier wave can be established. The operations of the structural elements shown in FIG. 7 other than the EPS 110 are the same as those shown in FIG. 3.

As mentioned in the above, according to the demodulator according to the invention, since the input level of the A/D convertor in the ordinary state, in which there is no fading, can be increased, the bit error rate characteristic in the ordinary state can be improved. Moreover, a time constant of the AGC amplifier, which keeps the average power of its output signal constant is not noticeably increased in accordance with the modulation level, the time constant of the AGC amplifier can be made to be smaller than that of the conventional demodulator, which keeps the maximum amplitude of the input signal of the A/D convertor constant. As the result, a demodulator quickly follows the fluctuation of the input signal level.

What is claimed is:

1. A demodulator for $2^q$ (q is an integer and $q \geq 2$)-quadrature amplitude modulation (QAM, thereinafter) system having I and Q Channels, comprising:

an analog automatic gain control (AGC, hereinafter) circuit, which is supplied with a modulated wave and operates so that an average power of an output signal thereof is kept to be constant, analog to digital (A/D, hereinafter) converters of said I and Q channels, which A/D convert base band (BB, hereinafter) analog signals of said I and Q channels obtained by demodulating said output signal of said analog AGC circuit, an equalizer, which is supplied with output signals of said A/D converters of said I and Q channels and removes interference components between codes contained therein, digital AGC circuits of said I and Q channels, which are supplied with output signals of said equalizer and operate so that convergent points of said output signals of said equalizer have amplitudes expressed by binary numbers composed of q/2 bits in case that q is even and (q+1)/2 bits in case that q is odd, and a control circuit, which is supplied with output signals of said digital AGC circuits of said I and Q channels and generates control signals for said digital AGC circuits of said I and Q channels.

2. The demodulator as defined in claim 1, wherein:

said analog AGC circuit is situated at a before stage of a mixer and a low pass filter for outputting said BB analog signal.

3. The demodulator as defined in claim 2, wherein:

said mixer is supplied with a local oscillating signal coherent with a carrier wave of said modulated wave.

4. The demodulator as defined in claim 2, wherein:

said mixer is supplied with a local oscillating signal, which has a frequency nearly a same as that of a carrier wave and is not coherent with said carrier wave.

5. The demodulator as defied in claim 1, wherein:

said digital AGC circuit comprises an integrator for outputting an AGC gain by integrating said control signal and a multiplier for multiplying said output signal of said equalizer by said AGC gain.

6. The demodulator as defined in claim 5, wherein:

said control circuit generates said control signal in accordance with a most significant bit and an error bit of a digital signal of said A/D converter circuit.

7. The demodulator as defined in claim 5, wherein:

said control circuit reduces said AGC gain by said control signal in case that a digital signal of said A/D converter is larger than a predetermined value, and increases said AGC gain by said control signal in case that said digital signal of said A/D converter is smaller than said predetermined value.

8. demodulator for $2^q$ (q is an integer and $q \geq 2$)-QAM systems having I and Q channels, comprising:

demodulating circuits of said I and Q channels, which are supplied with a modulated wave and convert it into BB analog signals of I and Q channels, analog AGC amplifiers of I and Q channels, which amplify said BB analog signals of I and Q channels so that their average output powers are kept to be constant, A/D converters of said I and Q channels, which A/D convert said BB analog signals supplied from said analog AGC amplifiers of I and Q channels, an equalizer, which is supplied with output signals of said A/D converters of I and Q channels and removes interference components between codes contained therein, digital AGC circuits of said I and Q channels, which are supplied with output signals of said equalizer and operate so that convergent points of said output signals of said equalizer have amplitudes expressed by binary numbers composed of q/2 bits in case that q is even and (q+1)/2 bits in case that q is odd, and a control circuit, which is supplied with output signals of said digital AGC circuits of said I and Q channels and generates control signals for said digital AGC circuits of said I and Q channels.

9. The demodulator as defined in claim 8, wherein:

said analog AGC circuit is situated at an after stage of a mixer and a low pass filter for outputting said BB analog signal.

10. The demodulator as defined in claim 9, wherein:

said mixer is supplied with a local oscillating signal coherent with a carrier wave of said modulated wave.

11. The demodulator as defined in claim 9, wherein:

said mixer is supplied with a local oscillating signal, which has a frequency nearly a same as that of a carrier wave and is not coherent with said carrier wave.

12. The demodulator as defied in claim 8, wherein:

said digital AGC circuit comprises an integrator for outputting an AGC gain by integrating said control signal and a multiplier for multiplying said output signal of said equalizer by said AGC gain.

13. The demodulator as defined in claim 12, wherein:

said control circuit generates said control signal in accordance with a most significant bit and an error bit of a digital signal of said A/D converter circuit.

14. The demodulator as defined in claim 12, wherein:

said control circuit reduces said AGC gain by said control signal in case that a digital signal of said A/D converter is larger than a predetermined value, and increases said AGC gain by said control signal in case that said digital signal of said A/D converter is smaller than said predetermined value.

* * * * *